United States Patent [19]

Marbot

[11] Patent Number: 5,334,891
[45] Date of Patent: Aug. 2, 1994

[54] VARIABLE DELAY CIRCUIT FOR PRODUCING A DELAY WHICH VARIES AS A HYPERBOLIC FUNCTION OF THE CURRENT INTENSITY

[75] Inventor: Roland Marbot, Versailles, France

[73] Assignee: Bull, S.A., Paris, France

[21] Appl. No.: 52,279

[22] Filed: Apr. 26, 1993

Related U.S. Application Data

[63] Continuation of Ser. No. 809,179, Dec. 18, 1991, abandoned.

[30] Foreign Application Priority Data

Dec. 27, 1990 [FR] France ................. 90 16340

[51] Int. Cl.⁵ ............................................. H03K 5/159
[52] U.S. Cl. ..................................... 307/603; 307/605;
307/608; 307/594; 307/595; 307/597; 328/55;
328/66
[58] Field of Search ............... 307/608, 602, 603, 605,
307/591, 595, 597; 328/55, 66

[56] References Cited

U.S. PATENT DOCUMENTS

| | | | |
|---|---|---|---|
| 4,422,052 | 12/1983 | Yorkanis et al. | 330/295 |
| 4,709,170 | 11/1987 | Li | 328/55 |
| 4,797,586 | 1/1989 | Traa | 307/603 |
| 4,862,020 | 8/1989 | Cowan et al. | 307/603 |
| 4,866,314 | 9/1989 | Traa | 307/603 |
| 4,893,036 | 1/1990 | Hester et al. | 307/608 |

FOREIGN PATENT DOCUMENTS 239696 10/1987 European Pat. Off. .
315385 5/1989 European Pat. Off. .

Primary Examiner—Timothy P. Callahan
Assistant Examiner—Trong Phan
Attorney, Agent, or Firm—Kerkam, Stowell, Kondracki & Clarke

[57] ABSTRACT

The variable delay device 10 includes an ECL gate 11 associated with an adjusting circuit 23 acting on the resistance of resistive load elements 14, 15 of transistors 12, 13 and the resistive load element 18 of the current source 16 at the gate 11 to cause the current produced by the source 16 to vary linearly while keeping the voltage at the collectors of the transistors 12, 13 constant. The range of variation of the resistances is selected in such a way that the delay between the input signals IN, IN* and OUT, OUT* varies substantially linearly. The invention is particularly applicable to systems for digital data transmission at a very high rate, of more than 1 gigabit per second.

17 Claims, 3 Drawing Sheets

VARIABLE DELAY CIRCUIT FOR PRODUCING A DELAY WHICH VARIES AS A HYPERBOLIC FUNCTION OF THE CURRENT INTENSITY

This is a continuation of application Ser. No. 07/809,179, filed Dec. 18, 1991, now abandoned.

RELATED APPLICATION

This application is related to my co-pending application Ser. No. 07/809,181 (BULL 3273) for ADJUSTABLE DELAY DEVICE filed concurrently herewith. The subject matter of said application is incorporated herein by reference.

FIELD OF THE INVENTION

The subject of the invention is a variable delay device. It applies in particular to systems for transmitting digital data at a very high rate, of more than one gigabit per second, for example.

BACKGROUND OF THE INVENTION

Current delay devices are presently made of RC circuits. Adjusting the delay is done by varying the resistance and/or capacitance. In an integrated circuit with field effect transistors, for instance of the MOS (metal oxide semiconductor) type, the resistance and capacitance are ordinarily constituted by transistors.

The disadvantage of such delay devices is the exponential curve of the variation in the delay with respect to the variation of the value of R and C. The linearity of the adjustment of the delay accordingly requires high-resistance and high-capacitance RC products, and this is incompatible with very short delay times. On the other hand, RC circuits must be inserted between input and output buffer circuits, making the external circuits insensitive to variations in R and C. Moreover, the technology for manufacturing field effect transistors engenders major fluctuations in the characteristics of the transistors of different integrated circuits. These fluctuations are an obstacle to the desired reliability and fineness of the delay adjustment.

OBJECT AND SUMMARY OF THE INVENTION

The invention introduces a variable delay device that offers the advantages of not having a logarithmic variation curve, of producing very short delays, of very finely and reliably adjusting the value of the delays, and of having a simple structure that is well adapted to being integrated into BiCMOS (bipolar/complementary MOS) integrated circuits without requiring input and output buffer circuits.

A variable delay device according to the invention is characterized in that it includes a differential amplifier, the current source and the two resistive load elements of which are associated with adjusting means that act in such a way that the product of the current and the resistance of each of the load elements is constant.

The characteristics and advantages of the invention will become apparent from the ensuing detailed description, given by way of example, taken in conjunction with the drawings.

DESCRIPTION OF THE PREFERRED EMBODIMENTS

Figure 1:
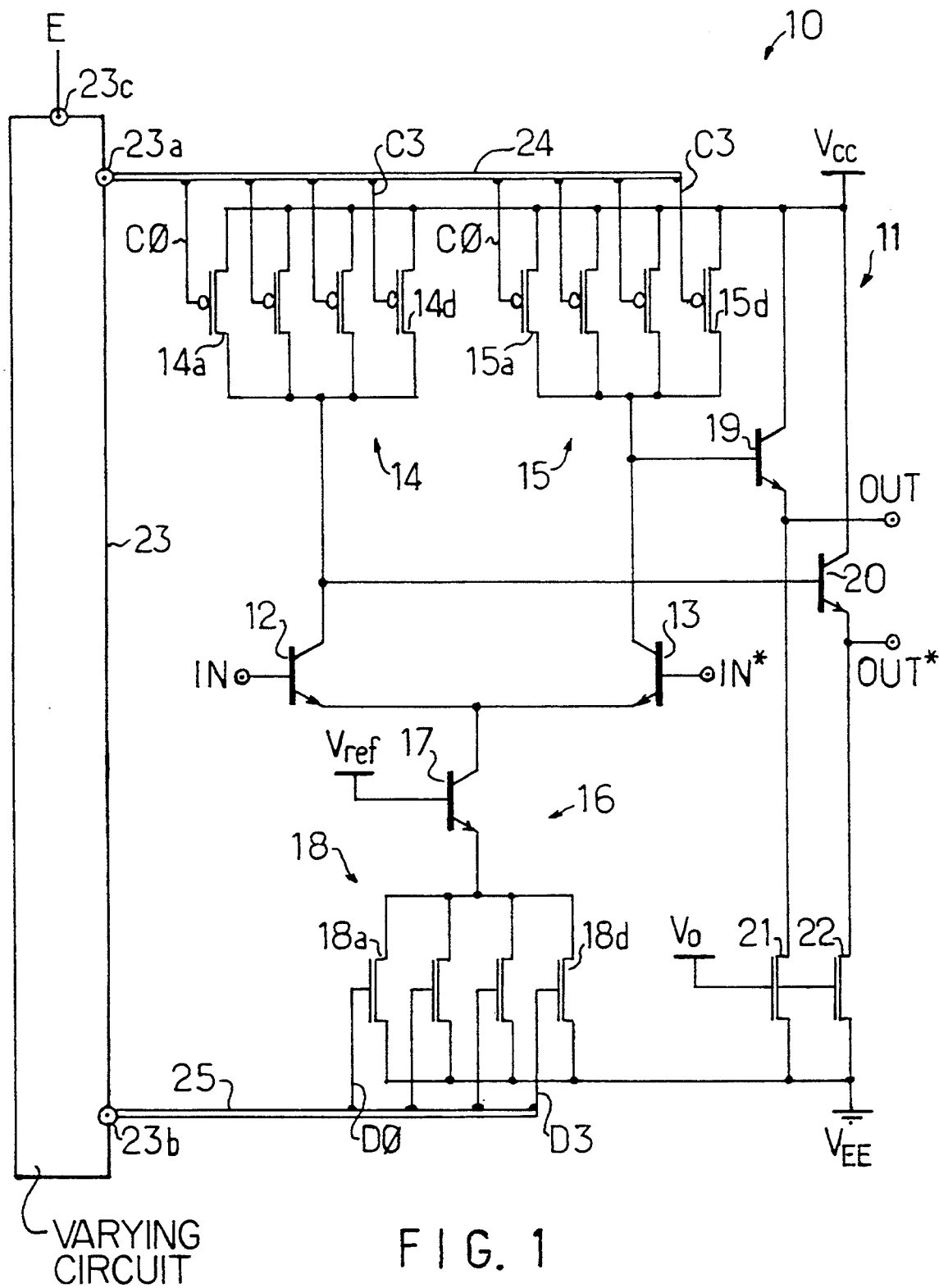
FIG. 1 is a schematic view of the circuit of a preferred embodiment of an adjustable delay device according to the invention.

In FIG. 1, the delay device 10 according to the invention is made beginning with an ECL (emitter-coupled logic) gate 11. It is supplied with voltage between the potentials $V_{CC}$ and $V_{EE}$, having values of +5 V and ground, for example. The two input bipolar transistors 12 and 13 of the gate 11 receive the direct input signal IN and the inverted input signal IN*, respectively, at their bases. Their collectors are connected to the potential $V_{CC}$ by way of respective resistive loads 14 and 15. Their emitters are joined and connected to the potential $V_{CC}$ by a current source 16 made of a bipolar transistors 17 and a resistive load 18. The transistor 17 has its collector connected to the emitters of the transistors 12 and 13, its emitter connected to the resistive load 18, and its base receiving a reference potential $V_{REF}$. The collectors of the transistors 12 and 13 are also connected to the bases of two bipolar transistors 19 and 20 that form two emitter-follower output amplifiers. Their collectors are connected to the potential $V_{CC}$ and their emitters are connected to the potential $V_{EE}$ by respective resistive elements 21 and 22 and furnish the complementary output signals OUT and OUT*. In the conventional manner, the resistive elements 21 and 22 are made of respective field effect transistors, such as MOS transistors. The resistance of such a transistor is predetermined upon manufacture, in particular by the electrical width of its gate electrode, and in practice by the voltage from the gate electrode to the source required to make the transistor conducting.

According to the invention, the ECL gate 11 includes a circuit 23 for adjusting the polarization current I produced by the source 16 and for adjusting the value R of each of the resistive loads 14 and 15, in such a way that their product IR is constant. In the example shown, the adjustment controlled by the circuit 23 is not continuous. The resistive loads 14 and 15 are each made of four resistive elements 14a–14d and 15a–15d, and the load 18 of the current source 16 is composed of four resistive elements 18a–18d. Each of the elements in each of the loads 14, 15 and 18 are formed of MOS transistors that have parallel drain-to-source paths. The transistors in the loads 14 and 15 are of the PMOS type, and their gate electrodes are joined to a bus 24 connected to a control terminal 23a of the adjusting circuit 23. The transistors in the load 18 are of the NMOS type, and their gate electrodes are joined to a bus 25 connected to another control terminal 23b of the circuit 23. The control terminals 23a and 23b furnish two control signals C and D, respectively, that are capable of assuming four different potential values C0–C3 and D0–D3 in response to a pilot control signal E applied to an input terminal 23c of the adjusting circuit 23.

Figure 2:
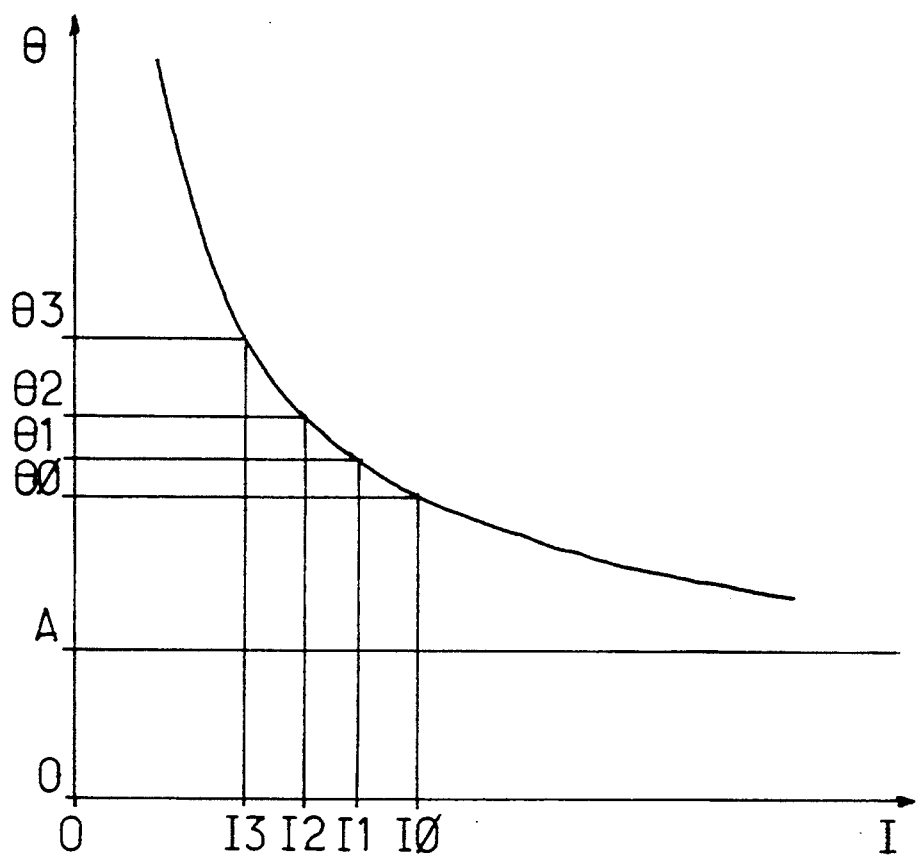
FIG. 2 is a graph showing the variation of the delay time of the device shown in FIG. 1.

The function of the adjustable delay device 10 shown in FIG. 1 will now be described with reference to the graph in FIG. 2. The graph shows the variations in the delay Θ of the complementary output signals OUT and OUT*, as a function of the variations in the current I, such that IR is constant. The variation in the polarization current is selected to be substantially linear. Under these conditions, the curve is a hyperbola of the type where $\Theta = A + B/I$, where A is the ordinal value of the horizontal asymptote (not shown) and B is a predetermined coefficient, which in the example shown equals 1. The four values $I\phi$–I3 of I are determined by the four respective value $D\phi$–D3 of the signal D for controlling the conduction of the corresponding transistors 18a–18d. Corresponding to the four values $D\phi$–D3 are the four values of $C\phi$–C3 that control the conduction of the respective transistors 14a–14d and 15a–15d that function as resistors. In the example shown, the value I0 corresponding to the values $C\phi$ and $D\phi$ is obtained by the conduction of the transistors 14a, 15a and 18a.

The four values $I\phi$–I3 are preferably selected in a substantially middle, linear portion of the curve, so that the four delay values $\Theta 1$–$\Theta 3$ that result are substantially equidistant from one another and are separated from one another by a desired value. From the graph, it is clear that highly scattered values of I will produce strongly nonlinear variations of $\Theta$, that values of I grouped in the horizontal asymptotic portion will produce values of $\Theta$ that cannot be differentiated very much from one another, and that in the vertical asymptotic portion, the desired values of $\Theta$ will be obtained for very slight variations of I, taking technological fluctuations into account.

The delay device 10 according to the invention has several advantages. The presence of bipolar transistors as active elements in the differential amplifier 11 lends a reliability and homogeneity of the delay time $\Theta$. It overcomes the problems of nonhomogeneity that would be present in a differential amplifier of the CMOS (complementary MOS) type because of the notable difference in delays in the NMOS and CMOS transistors compared with the very short delay time $\Theta$ of the via-hole of the delay device 10, which in the example shown are on the order of 250 ps. Another advantage resides in the use of complementary input signals IN and IN* at the bases of the transistors 12 and 13 of the ECL-type differential amplifier 11. In fact, the use of the input signal IN and a reference voltage would present a problem of centering the edge of the signal IN at the reference tension, because of the fluctuation in the characteristics of components between different integrated circuits. A shift in the centering would produce nonhomogeneous delays $\Theta$. Contrarily, in the example shown, the centering is done at the point of intersection of the edges of complementary input signals, which compensates for any fluctuation and assures a stable delay time.

The function of the adjusting circuit 23 in this case accordingly consists in converting the pilot control signal E into two control signals C and D, each having four values, corresponding to a substantially constant product IR. A converter of this kind is well known to one skilled in the art and need not be described here.

Numerous variants may be made in the exemplary embodiment shown. It is clear in particular that instead of the ECL gate shown, a simple differential amplifier with bipolar or field effect transistors may suffice in some cases. The advantage of an ECL gate resides principally in its very short delay and in its performance at high frequencies, which is due to the nonsaturation of its transistors 12 and 13, and the slight variation in its output voltages (voltage swing) as a function of frequency. It is also apparent from the above description that a more sophisticated adjusting circuit 23 and a better-adapted curve $\Theta = f(I)$ could enable denser, better-outlined and more linear variation of the delays $\Theta$. For example, a large number of resistors in the loads 14, 15 and 18 would enable very fine adjustment of the delay $\Theta$. In general, the current source in the ECL gate 11, or in a simple substitute differential amplifier, could include only the single resistor 18. In a variant, the signals controlling the current I could act solely upon the voltage controlling the conduction of the transistor 17, in other words on the base of this transistor. It has also been seen above that the ECL gate, or the substitute differential amplifier, could receive only the direct input signal IN, with the other input terminal being applied to a predetermined fixed potential. It is also possible for one skilled in the art to vary the delay $\Theta$ continuously. It would also be possible to vary the polarization current in accordance with a higher order function, of order 2, for example, so as to obtain a curve of the type $\Theta = A + B/I^2$, having more linear branches but markedly varying the delays $\Theta$. Additionally, if the desired delay times exceed the capacities of a single delay device 10, it is equally possible to assemble a plurality of devices 10 in the manner shown in FIGS. 3 and 4.

Figure 3:
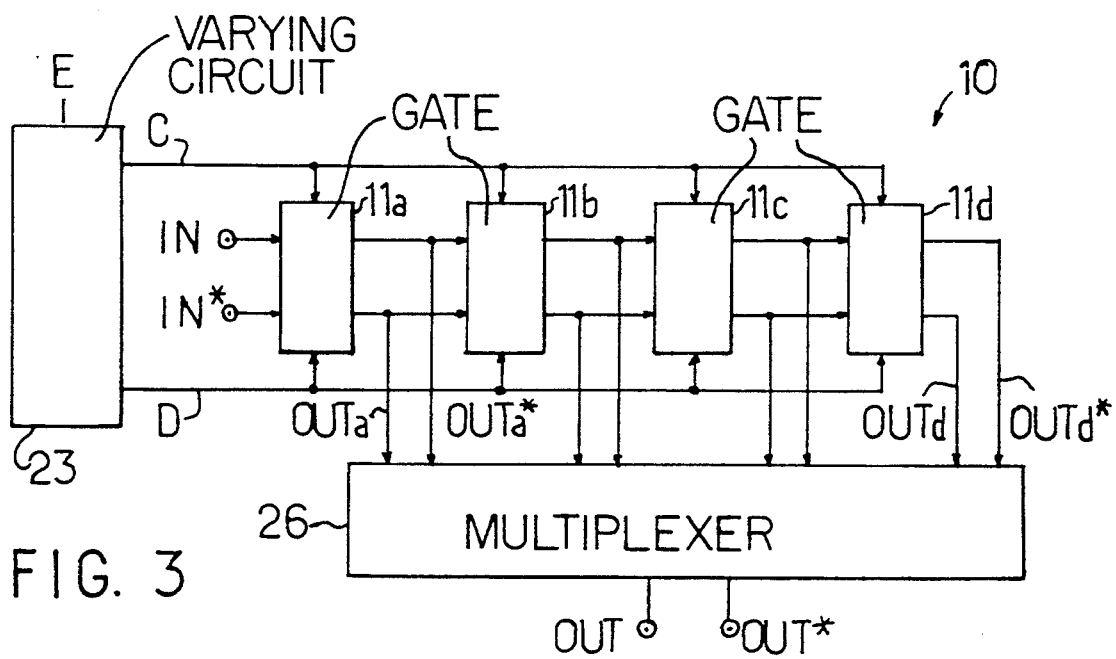
FIG. 3 is a block diagram of an embodiment of a delay device according to the invention, having a delay that is adjustable over a wide range of variation.

FIG. 3 is a block diagram showing the structure of a variant embodiment of the delay device 10 according to the invention, including four cascade-connected ECL gates 11a–11d. The gates 11a–11d are controlled by the same adjusting circuit 23 for successively delaying the input signals IN and IN*. Their output signals OUTa–OUTd and OUTa*–OUTd* are also applied to the respective inputs of a multiplexer 26, which furnishes the complementary output signals OUT and OUT* of the delay device 10. Given that the device 10 can provide four delay values, with a maximum delay on the order of 250 ps, it is possible to obtain a delay device 10 with 16 delay values $\Theta$, ranging up to a delay on the order of 1 ns, or the time needed for transmitting one bit at the rate of 1 gigabit per second. The assembly example in FIG. 3 suffices one skilled in the art for designing others of faster or slower performance as applicable, for example such as that shown in FIG. 4.

Figure 4:
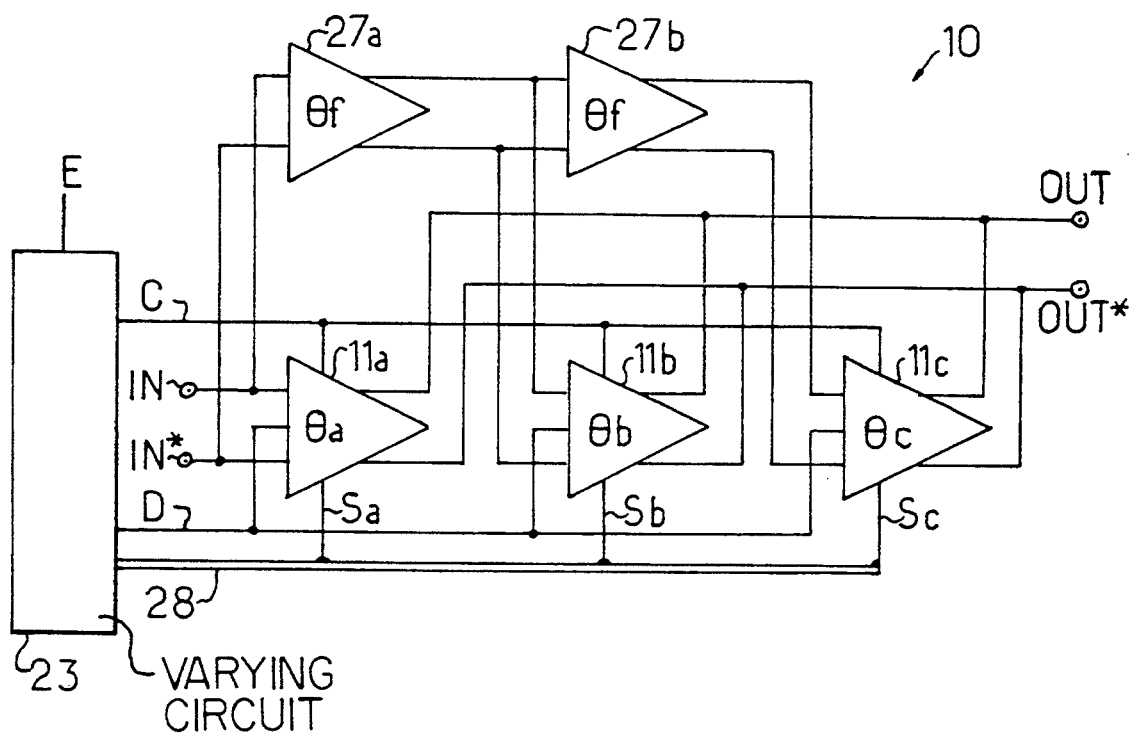
FIG. 4 is a block diagram of a variant embodiment of the delay device shown in FIG. 3.

In the example shown in block form in FIG. 4, the delay device 10 includes three ECL gates 11a–11c identical to the gate 11 in FIG. 1 and two ECL gates 27a, 27b of the same type as the gates 11a–11c, but including only one corresponding load resistor 14, 15 and 18 to produce a sixth delay $\Theta f$. The gates 11a–11c can share the same load resistors 14a–14b and 15a–15b as well as the same output amplifiers 19–22 and the same outputs. They are controlled by the same control signals C and D originating in the same adjusting circuit 23. The circuit 23 simply has in addition a selector (not shown) that furnishes selection signals Sa–Sc over a bus 28 to the respective gates 11a–11c. The gates 11a and 27a receive the input signals IN and IN*, and the gates 11b, 11c respectively receive the output signals of the gates 27a and 27b. The output signals of the gate 27a are also applied to the input terminals of the gate 27b. Functionally, selecting only the gate 11a furnishes a delay $\Theta a$ identical to the delay $\Theta$ of the gate 11 in FIG. 1. Selecting only the gate 11b furnishes the delay $\Theta b = \Theta f + \Theta$. Selecting only the gate 11c furnishes the delay $\Theta c = 2\Theta f + \Theta$. The resultant curve may be linear, if the ranges of variation $\Theta a$, $\Theta b$ and $\Theta c$ are associated without overlapping. However, to avoid any oscillation of the selector around the junction points of two delays furnished successively by the gates 11a and 11b, for example, it is preferably to overlap the various ranges to have a sawtooth curve and a generally linear variation without the risk of oscillation. In conclusion, the principle of this delay device consists in selectively adding at least one fixed delay Θf to the variable delay produced by at least one differential amplifier or one ECL gate 11. Generally, the fixed delays Θf may be identical to one another or different.

What is claimed is:

1. An variable delay device (10), comprising at least one differential amplifier (11) having first and second transistors (12, 13), a current source (16) for supplying current to said first and second transistors, first and second variable resistive load elements (14, 15) serially connected with said first and second transistors, respectively, varying means (123, 18a–18d) connected to said current source for varying current intensity supplied from the current source to produce a variable delay and maintaining means (23, 14a–14d, 15a–15d) for maintaining the voltages across each of said first and second load elements at a substantially constant value regardless of the current intensity flowing through said first and second load elements, whereby said variable delay varies as a hyperbolic function of the current intensity produced by the current source.

2. The device of claim 1, wherein the current source includes a third variable resistive load element (18) varied by the varying means to vary the current intensity.

3. The device of claim 1, wherein the maintaining means includes control terminal means and each of the first and second resistive load elements (14, 15) comprises a plurality of MOS transistors having parallel drain-to-source paths and gate electrodes connected in common to the control terminal means.

4. The device of claim 2, wherein the maintaining means includes control terminal means and each of the first and second resistive load elements (14, 15) comprises a plurality of MOS transistors having parallel drain-to-source paths and gate electrodes connected in common to the control terminal means.

5. The device of claim 1, wherein the current source includes a transistor (17) having a control electrode connected to a fixed reference potential (Vref) and a main current path serially connected to the third variable resistive load element.

6. The device of claim 1, wherein the current intensity is varied with a substantially linear variation.

7. The device of claim 2, wherein the current source has a polarization current with a substantially linear variation.

8. The device of claim 3, wherein the current source has a polarization current with a substantially linear variation.

9. The device of claim 4, wherein the current source has a polarization current with a substantially linear variation.

10. The device of claim 1, wherein the current intensity is varied with at least a squared function ($I^2$).

11. The device of claim 2, wherein the current intensity is varied with at least a squared function ($I^2$).

12. The device of claim 3, wherein the current intensity is varied with at least a squared function ($I^2$).

13. The device of claim 4, wherein the current intensity is varied with at least a squared function ($I^2$).

14. The device of claim 1, wherein the differential amplifier has two inputs which receive complementary versions of an input signal (IN).

15. The device of claim 1, wherein the differential amplifier is an ECL gate.

16. The device of claim 1, further including a plurality of differential amplifiers (11a–11d) having respective outputs applied to a multiplexer (16).

17. The device of claim 1, wherein said differential amplifier produces a first variable delay (Θ) and further comprises means (27a, 27b) for producing at least one fixed delay (Θf—FIG. 4) and selecting means (23, Sa–Sc) for selecting one of said at least one fixed delay and adding it to said variable delay to generate at least a second variable delay (Θa, Θb, Θc).

* * * * *

UNITED STATES PATENT AND TRADEMARK OFFICE
CERTIFICATE OF CORRECTION

PATENT NO. : 5,334,891

DATED : August 2, 1994

INVENTOR(S) : MARBOT

It is certified that error appears in the above-indentified patent and that said Letters Patent is hereby corrected as shown below:

Col. 5, line 15 (Claim 1, line 7) "(123, 18a-18d)" should be --(23, 18a-18d)--.

Col. 6, line 1 (Claim 5, line 1) "claim 1" should be --claim 2--.

Col. 6, line 32 (Claim 16, line 3) "(16)" should be --(26)--.

Signed and Sealed this

Third Day of January, 1995

Attest:

BRUCE LEHMAN

Attesting Officer     Commissioner of Patents and Trademarks